United States Patent
Torok et al.

(10) Patent No.: US 10,714,736 B2
(45) Date of Patent: Jul. 14, 2020

(54) BATTERY PACK SYSTEM WITH INTEGRATED BATTERY DISCONNECT MECHANISM

(71) Applicant: INTERNATIONAL BUSINESS MACHINES CORPORATION, Armonk, NY (US)

(72) Inventors: John G. Torok, Poughkeepsie, NY (US); Noah Singer, White Plains, NY (US); John S. Werner, Fishkill, NY (US); Arkadiy O. Tsfasman, Wappingers Falls, NY (US); Budy D. Notohardjono, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/115,872

(22) Filed: Aug. 29, 2018

(65) Prior Publication Data

US 2020/0075926 A1    Mar. 5, 2020

(51) Int. Cl.
*H01M 2/00* (2006.01)
*H01M 2/34* (2006.01)
(Continued)

(52) U.S. Cl.
CPC ....... *H01M 2/348* (2013.01); *H01M 10/4207* (2013.01); *H01M 10/4257* (2013.01);
(Continued)

(58) Field of Classification Search
CPC ...... H01M 2/348; H01M 2/202; H01M 2/206; H01M 10/4207; H01M 10/4257;
(Continued)

(56) References Cited

U.S. PATENT DOCUMENTS 6,377,432 B1   4/2002   Hashimoto
6,424,511 B1   7/2002   Levinas
(Continued)

FOREIGN PATENT DOCUMENTS

CN   104716289 A   6/2015
CN   106159177 A   11/2016
(Continued)

OTHER PUBLICATIONS

CellBlock Containment Fire Containment Systems—Product Brochure, "LIBIK—Lithium-Ion Battery Incident Kit," https://www.cellblockfcs.com, [Retrieved from the Internet on Aug. 15, 2018], (30 pages).

(Continued)

*Primary Examiner* — Raymond Alejandro
(74) *Attorney, Agent, or Firm* — Tihon Poltavets, Esq.; Kevin P. Radigan, Esq.; Heslin Rothenberg Farley & Mesiti P.C.

(57) ABSTRACT

A battery pack system is provided with an integrated battery disconnect mechanism. The battery pack system includes a circuit board and one or more battery packs connected to the circuit board. A battery pack of the one or more battery packs is connected to the circuit board via one or more connectors. The battery pack system also includes a disconnect mechanism configured to disconnect the battery pack from the circuit board with a failure event at the battery pack by disconnecting the one or more connectors connecting the battery pack to the circuit board. In an enhanced aspect, the battery pack is suspended from the circuit board by the one or more connectors, and the disconnecting of the one or more connectors by the disconnect mechanism with the failure event releases the battery pack to drop away from the circuit board.

8 Claims, 11 Drawing Sheets

(51) Int. Cl.
*H05K 1/18* (2006.01)
*H05K 7/14* (2006.01)
*H01M 10/42* (2006.01)

(52) U.S. Cl.
CPC .......... *H05K 1/181* (2013.01); *H05K 7/1427* (2013.01); *H01M 2010/4271* (2013.01); *H01M 2200/103* (2013.01); *H05K 2201/10037* (2013.01); *H05K 2201/10181* (2013.01); *H05K 2201/10189* (2013.01)

(58) Field of Classification Search
CPC ...... H01M 2010/4271; H01M 2200/10; H05K 1/181; H05K 7/1427; H05K 2201/10037; H05K 2201/10181; H05K 2201/10189
See application file for complete search history.

(56) References Cited

U.S. PATENT DOCUMENTS

| | | |
|---|---|---|
| 7,511,456 B2 | 3/2009 | Lee et al. |
| 8,547,069 B2 | 10/2013 | Jang |
| 9,525,194 B2 | 12/2016 | Ulicny et al. |
| 9,768,473 B2 | 9/2017 | Roh et al. |
| 2002/0155348 A1 | 10/2002 | Gitto |
| 2004/0041682 A1 | 3/2004 | Pasha et al. |
| 2005/0170238 A1 | 8/2005 | Abu-Isa et al. |
| 2009/0014188 A1 | 1/2009 | Hesch et al. |
| 2009/0239132 A1 | 9/2009 | Johnson |
| 2010/0028758 A1 | 2/2010 | Eaves et al. |
| 2012/0079859 A1 | 4/2012 | Lakamraju et al. |
| 2012/0274140 A1* | 11/2012 | Ganor .................. H02J 7/0011 307/71 |
| 2013/0316198 A1 | 11/2013 | Bandhauer et al. |
| 2015/0357692 A1* | 12/2015 | Piggott ............. H01M 10/6572 320/107 |
| 2017/0098814 A1 | 4/2017 | Golubkov |

FOREIGN PATENT DOCUMENTS

| | | |
|---|---|---|
| JP | 2000-294099 A | 10/2000 |
| KR | 2017-0025872 A | 3/2017 |
| KR | 10-1792820 B1 | 11/2017 |

OTHER PUBLICATIONS

PlaneGard, "Protect People and Property with PlaneGard," http://www.planegard.com, [Retrieved from the Internet on Aug. 15, 2018], (9 pages).

* cited by examiner

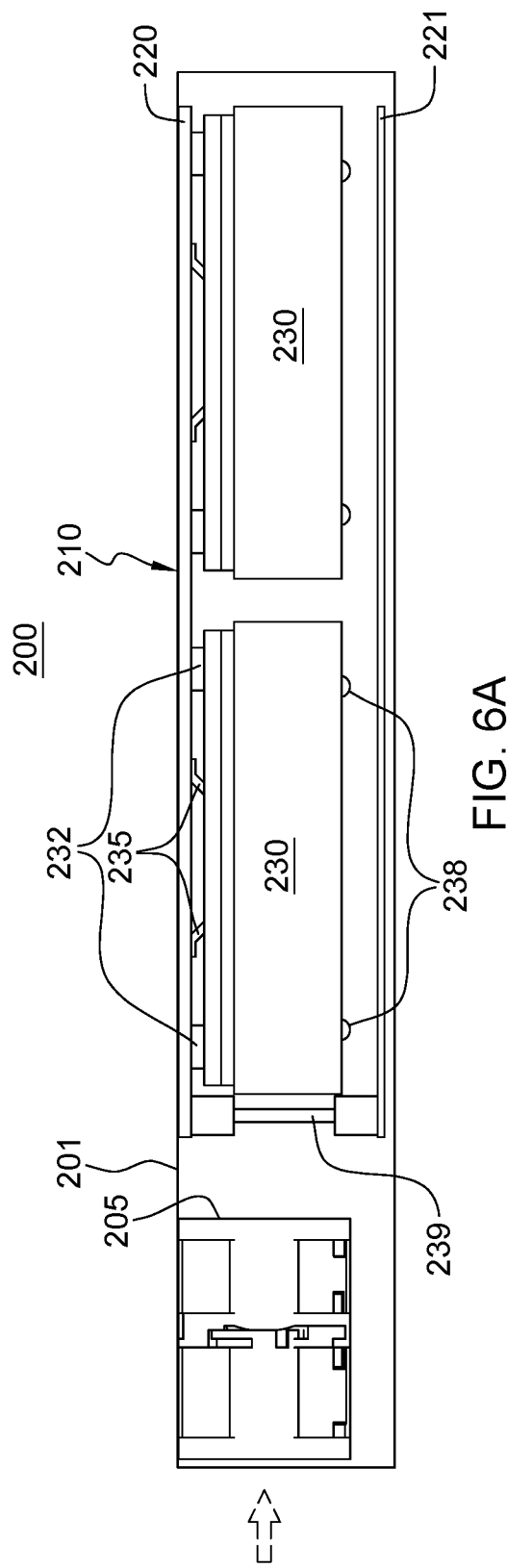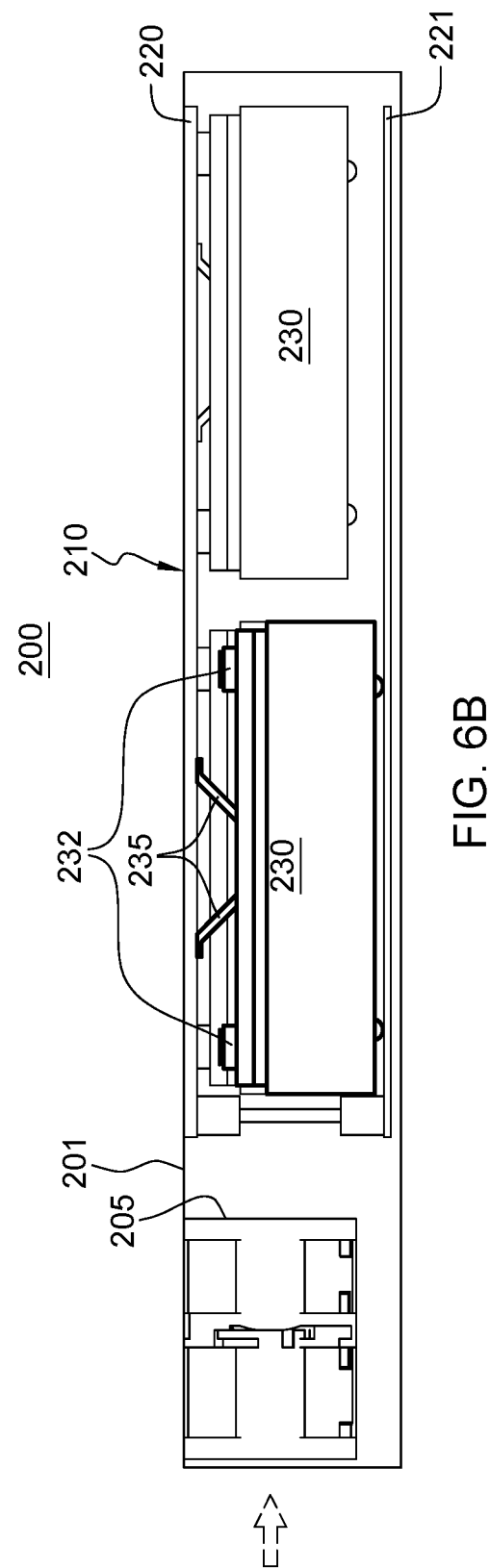

BATTERY PACK SYSTEM WITH INTEGRATED BATTERY DISCONNECT MECHANISM

BACKGROUND

There are a wide variety of rechargeable batteries available today for use as energy sources, including as backup energy sources. Lithium-ion batteries are one type of rechargeable battery in which lithium ions move from a negative electrode to a positive electrode during discharge and back when charging. An intercalated lithium compound is used in a lithium-ion battery as one electrode material. The electrolyte, which allows for ionic movement, and the two electrodes are constituent components of a lithium-ion battery cell. A cell is a basic electrochemical unit that contains the electrodes, separator and electrolyte. A battery or battery pack is a collection of one or more cells or cell assemblies. These may be ready for use in an electronic device by providing an appropriate housing, and electrical interconnections.

Recent events have highlighted the potential for thermal runaway events with the application of lithium-ion-technology-based batteries. For instance, lithium-ion-based batteries have the potential to experience an internal short circuit, which can lead to thermal runaway. During thermal runaway, a battery can reach temperatures of 1000° F., or more, at which point the flammable electrolyte can ignite, or even explode, when exposed to oxygen in air. Such failure incidents can be dangerous to anyone or anything nearby at the time of the event.

SUMMARY

Certain shortcomings of the prior art are overcome and additional advantages are provided herein through the provision of a battery pack system which includes a circuit board and one or more battery packs connected to the circuit board. A battery pack of the one or more battery packs is connected to the circuit board via one or more connectors. The battery pack system further includes a disconnect mechanism configured to disconnect the battery pack from the circuit board with a failure event at the battery pack by disconnecting the one or more connectors connecting the battery pack to the circuit board.

In a further aspect, a battery pack system is provided which includes a housing, a circuit board disposed within the housing, and multiple battery packs electrically connected to the circuit board within the housing. A battery pack of the multiple battery packs is suspended within the housing by one or more connectors. The battery pack system further includes a disconnect mechanism configured to disconnect the battery pack with a failure event at the battery pack by, at least in part, disconnecting the one or more connectors suspending the battery pack within the housing. The disconnecting of the one or more connectors by the disconnect mechanism with a failure event releases the battery pack to drop within the housing.

In a further aspect, a method of fabricating a battery pack system is provided. The method includes providing a circuit board, and suspending one or more battery packs from the circuit board. The suspending includes suspending a battery pack of the one or more battery packs from the circuit board via one or more connectors. Further, the method includes providing a disconnect mechanism configured to disconnect the battery pack from the circuit board with a failure event at the battery pack by disconnecting the one or more connectors suspending the battery pack from the circuit board. The disconnecting of the one or more connectors by the disconnect mechanism with the failure event releases the battery pack to drop away from the circuit board.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A is a cross-sectional, elevational depiction of the battery pack system embodiment of FIG. 3, with the battery packs shown operatively connected to and suspended from the circuit board, in accordance with one or more aspects of the present invention;

FIG. 6B depicts the battery pack system of FIG. 6A, after disconnect of one of the battery packs from the circuit board with occurrence of a failure event at the battery pack, in accordance with one or more aspects of the present invention;

DETAILED DESCRIPTION

Figure 1:
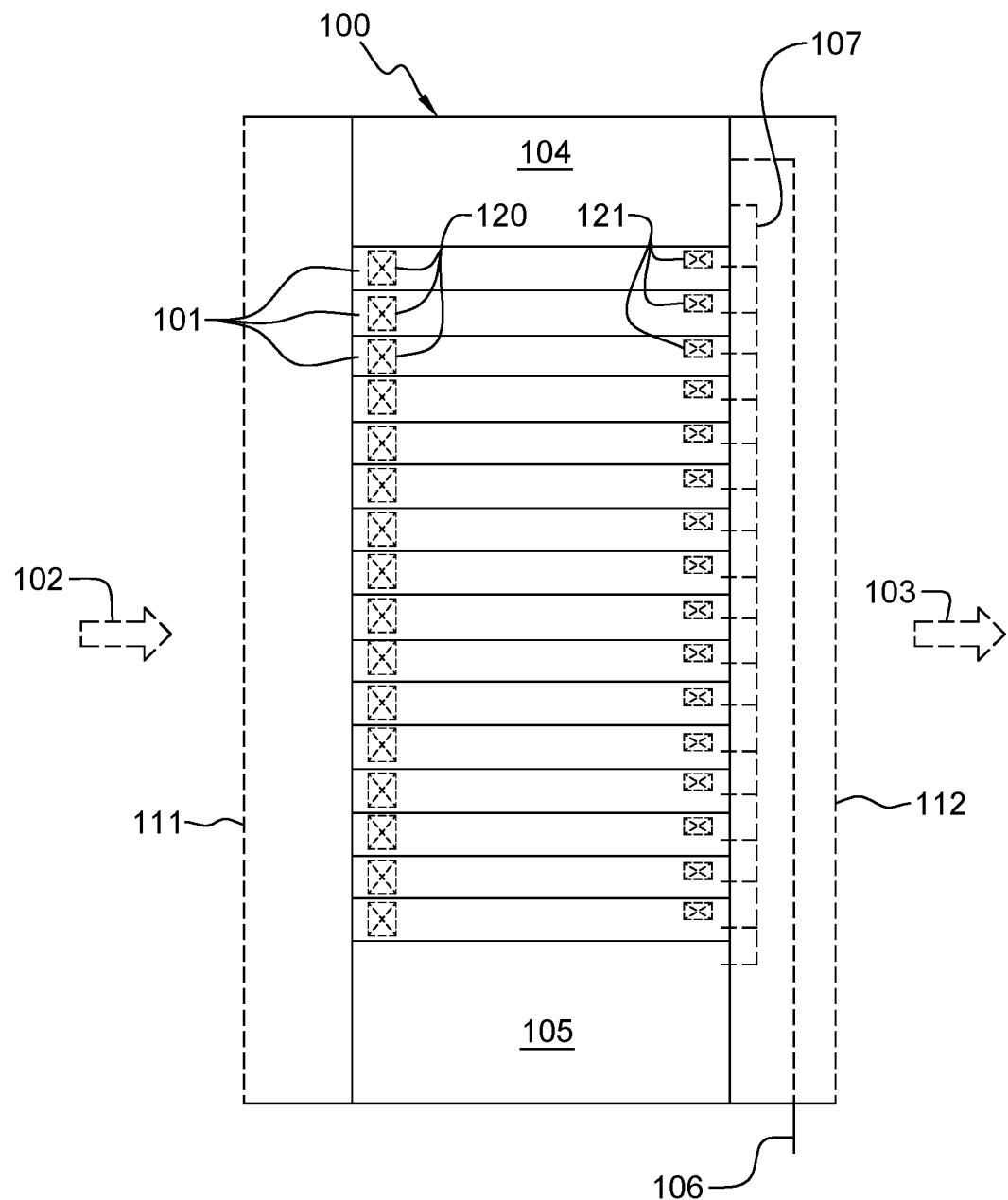
FIG. 1 is a cross-sectional elevational view of one embodiment of an air-cooled electronics rack, such as an air-cooled server rack, which can employ one or more battery pack systems, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and this specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of a battery pack system with an integrated battery disconnect mechanism, in accordance with one or more aspects of the present invention.

As noted, lithium-ion batteries are used today in many applications, including tablets, laptops, portable computers, etc., due to certain inherent advantages over other rechargeable battery technologies, including, for instance, a higher power density, a lower weight, a lower self-discharge, and little or no "memory" effect. Although rare, lithium-ion batteries have been known to be subject to a failure event, and can be a fire hazard, with the potential to even explode, and therefore can possess a safety concern to anyone or anything nearby. The chemistry of the cell, high energy density, and a flammable electrolyte, are factors that contribute to the potential for thermal runaway, which although rare, remains a concern. During thermal runaway, a lithium-ion battery can eventually reach temperatures of 1000° F., or more, at which point the flammable electrolyte can ignite, or even explode when exposed to oxygen in the air.

In a battery pack system, a failure of one battery or battery pack has the potential to cause thermal runaway in one or more neighboring batteries, leading to the possibility for an even greater catastrophic event. There are many safety standards that are to be met surrounding use of lithium-ion batteries in fire enclosures. For instance, reference IEC 60950 regarding Information Technology Equipment Safety, IEC 62368 regarding Audio-Video, Information and Communication Technology Equipment Safety, UL 1973 standard for Safety—Batteries for Use in Light Electric Rail (LER) Applications and Stationary Applications, etc. In many applications, a lithium-ion battery can be completely enclosed to help contain any potential fire. Such designs, however, can be a disadvantage when lithium-ion batteries are to be used in a larger air-cooled system, such as an air-cooled electronics rack. When used within a system or subsystem with perforated openings for airflow cooling of components, there is a concern that a potential fire could spread to other systems or components within the larger system.

By way of example, in a data center installation, such as an air-cooled computer room, there can be multiple electronics or information technology (IT) racks disposed within rows in the data center. Cooling within the data center is typically in a front-to-back cooling approach. Namely, according to this approach, cooled air is drawn in through a front (air inlet side) of each rack, and hot air is exhausted from a back (air outlet side) of each rack. The cooled air drawn into the front of a rack can be supplied to air inlets of the computing components (e.g., servers) disposed within the racks. The cooled air, which can be provided through one or more perforated tiles into cold air aisles of the data center, is drawn into the racks, heated and subsequently exhausted into the data center via one or more air outlets of the individual racks into hot air aisles of the data center.

FIG. 1 depicts, by way of example only, one embodiment of an electronics rack 100 with a plurality of electronic subsystems 101 to be cooled. In the embodiment illustrated, electronic subsystems 101 are air-cooled by cool airflow 102 ingressing at air inlet side 111, and exhausting out air outlet side 112 as hot airflow 103. By way of example, one or more axial fan assemblies 120 can be provided at the air inlet sides of electronic subsystems 101 and/or one or more centrifugal fan assemblies 121 can be provided at the air outlet sides of electronic subsystems 101 to facilitate airflow through the individual subsystems 101 as part of the cooling apparatus of electronics rack 100. One or more of electronic subsystems 101 can include heat-generating components to be cooled of a computer system, electronics system, and/or information technology (IT) equipment. For example, one or more of electronic subsystems 101 can include one or more processors and associated memory.

Electronics rack 100 can also include, by way of example, one or more bulk power assemblies 104 of an AC to DC power supply assembly. AC to DC power supply assembly further includes, in one embodiment, a frame controller, which can be resident in bulk power assembly 104 and/or in one or more electronic subsystems 101. Also illustrated in FIG. 1 is one or more input/output (I/O) drawer(s) 105, which can also include a switch network. I/O drawer(s) 105 can include, as one example, PCI slots and disk drivers for the electronics rack.

In the depicted implementation, a three-phase AC source feeds power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, axial or centrifugal fan assemblies could alternatively, or also, reside within, for instance, bulk power assembly 104, or I/O drawer(s) 105. Again, the particular electronics rack 100 configuration of FIG. 1 is presented by way of example only, and not by way of limitation.

In one or more implementations, battery packs, such as lithium-ion-technology-based battery packs, can be incorporated into an electronics rack, such as electronics rack 100 of FIG. 1, as backup power sources should rack power be interrupted. To facilitate safe use of such batteries in this context, battery pack systems are disclosed herein with integrated battery disconnect mechanisms which operate to disconnect one or more failing battery packs with detection of a failure event(s) at the battery pack(s). For instance, in one or more embodiments, lithium-ion battery packs or modules are suspended from a structure, such as a circuit board or a housing, via one or more connectors. The housing of the battery pack system can be a perforated housing or enclosure to allow airflow through the system to cool components within the system, as well as outside the system. A disconnect mechanism is provided configured to disconnect a battery pack with a failure event by, for instance, disconnecting the one or more connectors suspending that battery pack within the housing. For instance, if a lithium-ion battery within a lithium-ion battery pack begins to experience thermal runaway, heat transfers from the battery through, for example, a thermal interface material to a disconnect mechanism. As explained herein, the disconnect mechanism can be or include, for instance, one or more thermally activated elements formed of thermally activated material. When the thermally activated element(s) reaches a transition temperature, a force great enough to decouple the affected battery pack's connectors is applied between the battery pack and the structure from which the battery pack is suspended. The resultant dislodging of the lithium-ion battery pack electrically disconnects the pack from the structure, and drops the pack a safe distance away from the other battery packs to prevent cascading in the event of an ignition.

As noted, the disconnect mechanism can be, or can include, one or more thermally activated elements formed of thermally activated material which expands when activated and which applies a force great enough to effect the decoupling of the battery pack at issue. For instance, in one or more embodiments, the battery packs include a thermal interface material coupling the lithium-ion batteries to a heat sink, which is also coupled to the thermally activated element(s). Such a configuration is a passive, self-regulating system, because during normal operation, heat from the batteries is transferred to the heat sink and removed via airflow, but when the heat of the batteries exceeds normal operation, the airflow can no longer remove all of the heat from the heat sink, and the effected thermally activated element(s) begin to heat up. Once the transition temperature is reached, and the element(s) transitions, the affected battery pack becomes disconnected from, for instance, the circuit board, thereby facilitating protecting against greater damage to the battery pack system, or other systems within the rack. In the event that multiple battery packs are connected in series, the dislodged battery pack can include contacts and/or leads that complete a bypass circuit when dropped such that the remaining battery packs continue to operate as designed.

Generally stated, disclosed herein are battery pack systems and methods of fabrication with integrated battery failure disconnect mechanisms. A battery pack system includes a circuit board, one or more battery packs connected to the circuit board, and a disconnect mechanism. A battery pack of the one or more battery packs is connected to the circuit board via one or more connectors, and the disconnect mechanism is configured to disconnect the battery pack from the circuit board with a failure event at the battery pack by disconnecting the one or more connectors from the battery to the circuit board.

In one or more embodiments, the battery pack is suspended from the circuit board by the one or more connectors, and the disconnecting of the one or more connectors by the disconnect mechanism with a failure event facilitates releasing the battery pack to drop away from the circuit board. The battery pack system and/or housing containing the battery pack system can be configured such that the disconnected or dislodged battery pack drops a safe distance away from the other battery packs (e.g., other lithium-ion battery packs) to prevent cascading of a failure event, such as a thermal runaway event.

In one or more implementations where the battery pack is suspended from the circuit board, the disconnect mechanism can be located between the battery pack and the circuit board. In one or more embodiments, the disconnect mechanism includes one or more thermally activated elements formed of thermally activated material, and the failure event is an excessive temperature event at the battery pack. The thermally activated element(s) transitions to an extended state with the excessive temperature reaching a transition temperature of the thermally activated material, and the thermally activated element(s) is configured and sized to force, in the extended state, the battery pack away from the circuit board to disconnect the one or more connectors connecting the battery pack to the circuit board, thereby allowing the battery pack to drop away from the circuit board. In one or more embodiments, the thermally activated material is a shape-memory alloy. In one or more other embodiments, the thermally activated material includes a bimetallic material, or strip, or an intumescent material.

In one or more other embodiments, the disconnect mechanism can include a controller to monitor for the failure event, and a separator to disconnect the battery pack based on the controller detecting the failure event. For instance, where the battery pack is suspended from the circuit board by the one or more connectors, the separator can be disposed between the circuit board and the battery pack, and controlled by the controller.

In one or more embodiments, the one or more connectors include at least one electrical connector, and the disconnect mechanism disconnects or open-circuits the at least one electrical connector to electrically disconnect the battery pack from the circuit board with occurrence of the failure event at the battery pack. In one or more implementations, the one or more battery packs can be part of a charging circuit, and the battery pack system can further include a switching mechanism to switch in an impedance to the charging circuit with disconnecting of the battery pack by the disconnect mechanism based on the failure event.

In one or more other embodiments, a battery pack system is disclosed herein which includes a housing, a circuit board disposed within the housing, and multiple battery packs electrically connected to the circuit board within the housing. A battery pack of the multiple battery packs is suspended within the housing by one or more connectors. For instance, the battery pack can be suspended from the housing itself, or another structure within the housing. The battery pack system further includes a disconnect mechanism configured to disconnect the battery pack with a failure event at the battery pack by, at least in part, disconnecting the one or more connectors suspending the battery pack within the housing. The disconnecting of the one or more connectors by the disconnect mechanism with a failure event releases the battery pack to drop within the housing.

Disclosed herein are structures and methods for facilitating disconnecting a battery pack, and for containing a battery pack experiencing a thermal event. In one or more further implementations, the disconnect method includes receiving voltage data and temperature data for a battery pack electrically connected to a circuit board, such as a printed circuit board. Responsive to the controller receiving the data, the process includes determining that either a voltage threshold or a temperature threshold has been exceeded for the battery pack, and if so, the controller activates a disconnect or release mechanism to electrically disconnect the battery pack from the circuit board. Along with electrically disconnecting the pack from the circuit board, the controller can send a notification to a user, where the notification can include an identification of the battery pack, as well as the voltage threshold and/or temperature threshold that has been exceeded.

In one or more embodiments, the system can include a printed circuit board, one or more battery packs, a disconnect or release mechanism, and a containment housing, enclosure, vessel, etc. The battery pack(s) is situated inside the housing and electrically coupled to the circuit board, and the disconnect mechanism couples the battery pack to a structure within the housing, such as a top surface of the housing. The disconnect mechanism can be, or can include, any one of a variety of disconnect mechanisms including, for instance, an actuator, a solenoid, an electrical switch, a thermally activated material, etc. The release mechanism operates to electrically decouple a failing battery pack from the circuit board, as well as to mechanically decouple the failing battery pack from, for instance, the top of the housing, or other structure within the housing to which the battery pack is coupled.

Figure 2:
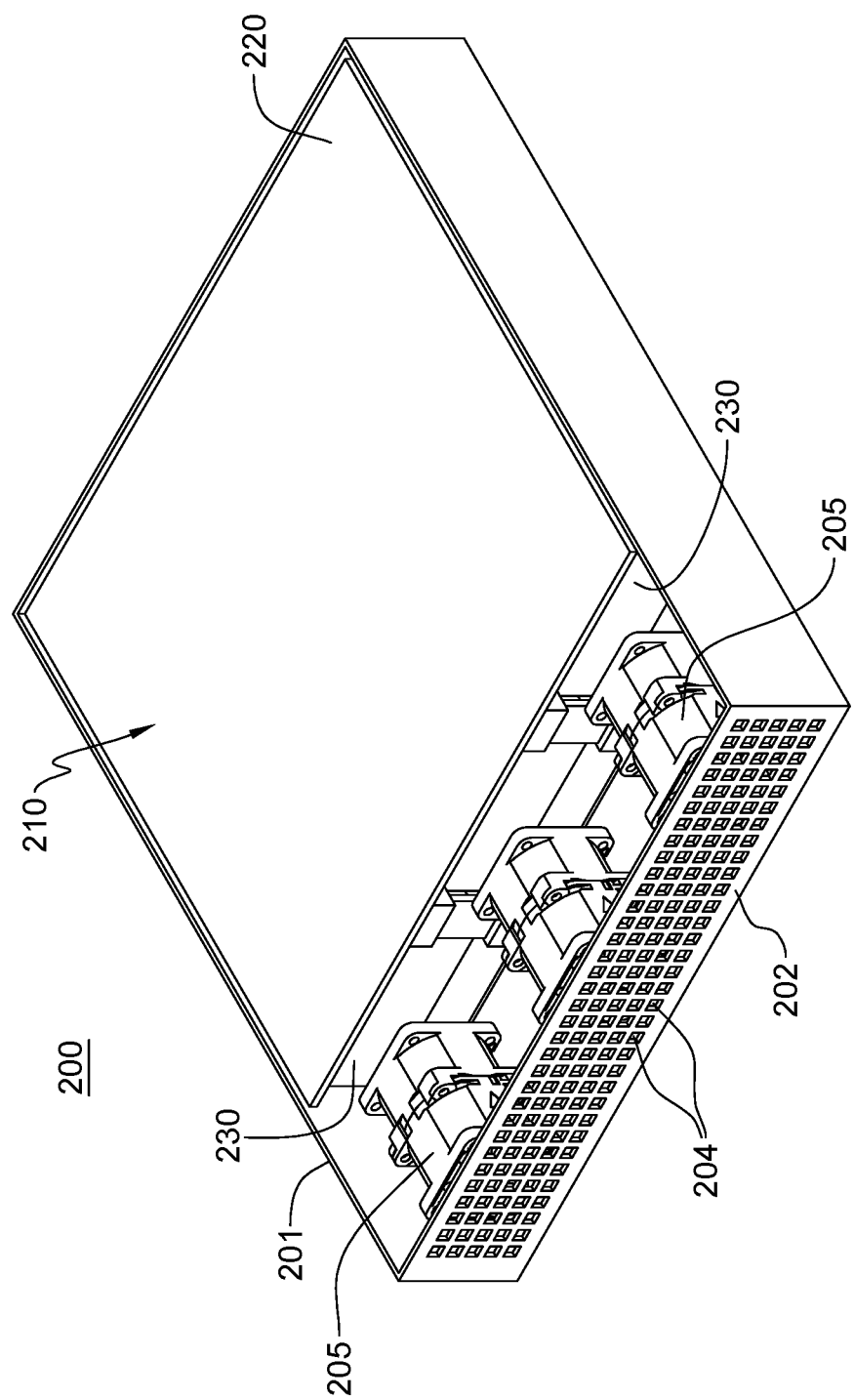
FIG. 2 depicts one embodiment of a battery pack system, in accordance with one or more aspects of the present invention.

FIG. 2 depicts one embodiment of a power subsystem 200 (such as a backup power system), which can be used in a variety of air-cooled systems or devices, such as air-cooled electronics rack 100 of FIG. 1. As shown, power system 200 includes a housing 201, which also includes a cover (not shown). In one or more embodiments, housing 201 is designed to withstand high temperatures and a potential battery ignition. For instance, housing 201 can be designed with a flame rating of V2, or better. Housing 201 contains perforations 204 at the front and rear sides 202, 203 (see FIG. 3) of the housing for airflow to pass through the housing. Airflow through the system is facilitated by one or more air-moving devices 205 within the system, or associated with the system.

Power system 200 includes a battery pack system 210, in accordance with one or more aspects of the present invention. In one or more embodiments, battery pack system 210 includes a circuit board 220 and one or more battery packs 230 coupled or connected to circuit board 220. For instance, circuit board 220 includes upper and lower main surfaces, one or both of which can include conductive lines or circuits, such as formed today using printed circuit board technology. In one or more embodiments, the battery packs 230 can be coupled to a surface of circuit board 220 so as to be suspended from the circuit board. Further, in one or more implementations, the battery packs 230 each include one or more batteries based on, for instance, lithium-ion-based technology. The battery packs 230 and circuit board 220 can be mounted towards the top of housing 201 to allow room, for instance, for a battery pack experiencing a failure event, to disconnect from the board and fall away from the other battery packs. Note that the configuration of housing 201 can be adjusted to provide the space required for a failing battery pack to drop away from the non-failing battery pack(s) within the battery pack system.

Figure 3:
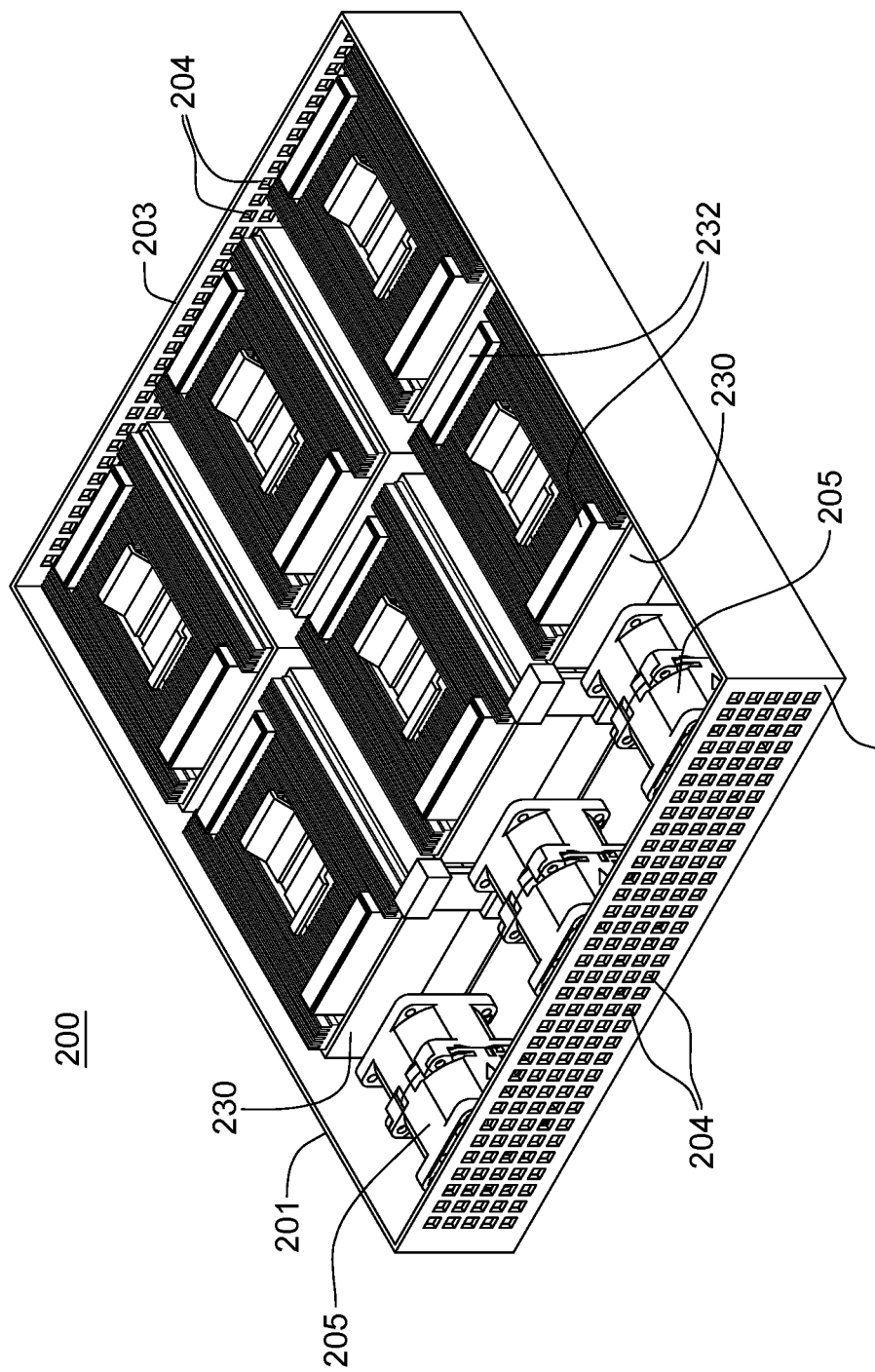
FIG. 3 depicts the battery pack system of FIG. 2, with the circuit board removed to illustrate, by way of example, six battery packs within the battery pack system, in accordance with one or more aspects of the present invention.

In one or more embodiments, a plurality of battery packs, such as a plurality of lithium-ion battery packs or modules, with additional circuitry as needed, can be connected to circuit board 220. FIG. 3 depicts power subsystem 200 with circuit board 220 removed to illustrate a battery pack embodiment which includes six battery packs 230. FIG. 3 also better illustrates front side 202 and back side 203 of housing 201, with airflow openings 204 to facilitate airflow through power subsystem 200.

Figure 4B:
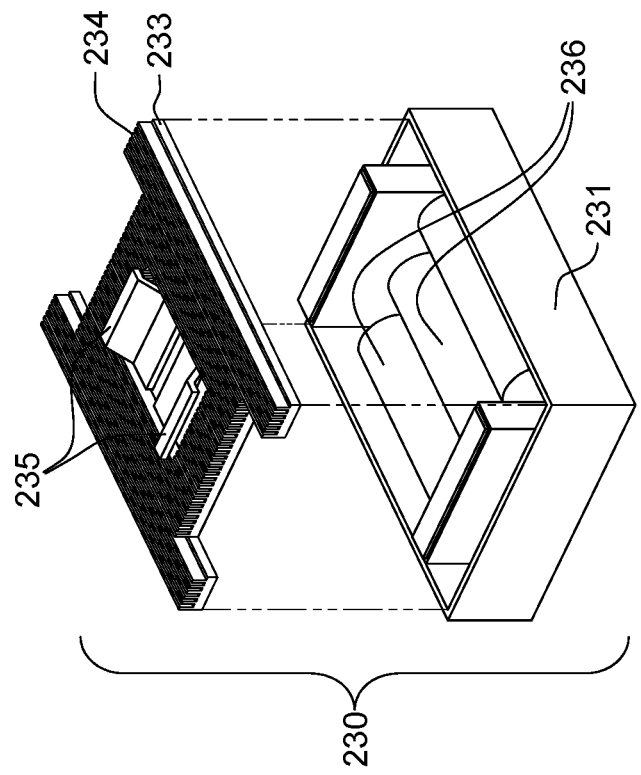
FIG. 4B is a partially exploded view of the battery pack of FIG. 4A, in accordance with one or more aspects of the present invention.
Figure 4A:
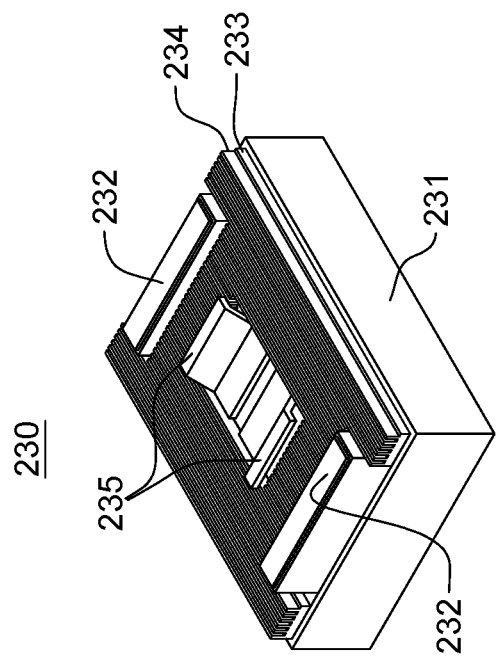
FIG. 4A is an enlarged depiction of a battery pack of FIG. 3, in accordance with one or more aspects of the present invention.

FIGS. 4A & 4B depict enlarged views of a battery pack 230 of the battery packs 230 depicted in the battery pack system of FIG. 3. Referring collectively to FIGS. 3-4B, a battery pack 230 can include a housing 231 holding multiple batteries 236, which (in one embodiment) are electrically and mechanically connected via connectors 232 to circuit board 220 (FIG. 2). Note that an embodiment of three batteries 236 per pack 230 is depicted in FIG. 4B, by way of example only. A battery pack can include one, two, three, or more batteries, as desired for a particular application. Further, in one or more embodiments, each battery 236 can be a lithium-ion-technology-based battery, or other technology-based battery as described herein. Connectors 232 can utilize a plurality of pins and sockets, as well as, for instance, a press-fit connection to connect and suspend battery pack 230 from circuit board 220 as depicted, for instance, in FIG. 2. A thermal interface material (TIM) layer 233 is provided to thermally couple batteries 231 to an air-cooled heat sink 234, and to one or more thermally activated elements 235 disposed between each battery pack 230 and circuit board 220. Note also that the battery packs of FIG. 3 can be connected in series (in one embodiment), with each battery pack containing, for instance, multiple batteries, such as the three lithium-ion batteries per pack depicted in FIG. 4B. In one or more alternative embodiments, the battery packs can be connected in parallel, or a combination of series and parallel. Further, as noted, the number of batteries per pack, and the number of packs per system, can be varied for a particular application, as desired.

The thermally activated elements 235 can be formed of a thermally active material, such as shape-memory alloy. Alternative embodiments could use a bimetallic strip, or other thermally activated mechanism capable of applying force to push the respective battery pack with a thermal runaway event away from the circuit board, and away from other battery packs of the system. As understood in the art, a shape-memory alloy (SMA) is an alloy material that "remembers" its original shape, and that when deformed, returns to its pre-deformed shape when heated. A shape-memory alloy is a lightweight, solid state alternative to a conventional actuator, such as a hydraulic, pneumatic, or motor-based actuator system. Many different materials can be used for a shape-memory alloy that have different transition temperatures and response times on the order of seconds. For instance, Nitinol is available with transition temperatures ranging from −100° C. to 100° C. Nitinol is both current and heat activated, and has up to 10% recoverable strain. Transition happens as soon as the shape-memory alloy reaches its activation temperature.

Alternatively, the thermally activated material could be an intumescent material. An intumescent material is a material that undergoes a chemical change when exposed to heat or flames, becoming viscous, then forming expanding bubbles that harden into a dense, heat-insulating multicellular char. Typically, intumescent material is used for containment of fire and toxic gases by inhibiting flame penetration, heat transfer, and transport of toxic gases from the site of a fire to other parts of a structure. The time to expand an intumescent material is dependent on the properties of the specific material used. Many different intumescent materials could be used that have different transition temperatures. Intumescent materials would react slower than shape-memory alloy materials, but still expand at a rate fast enough to transition before a potential lithium-ion battery ignition occurs. Intumescent materials would have the further benefit of providing fire protection in the area of ignition if a lithium-ion battery does fail.

Figure 5:
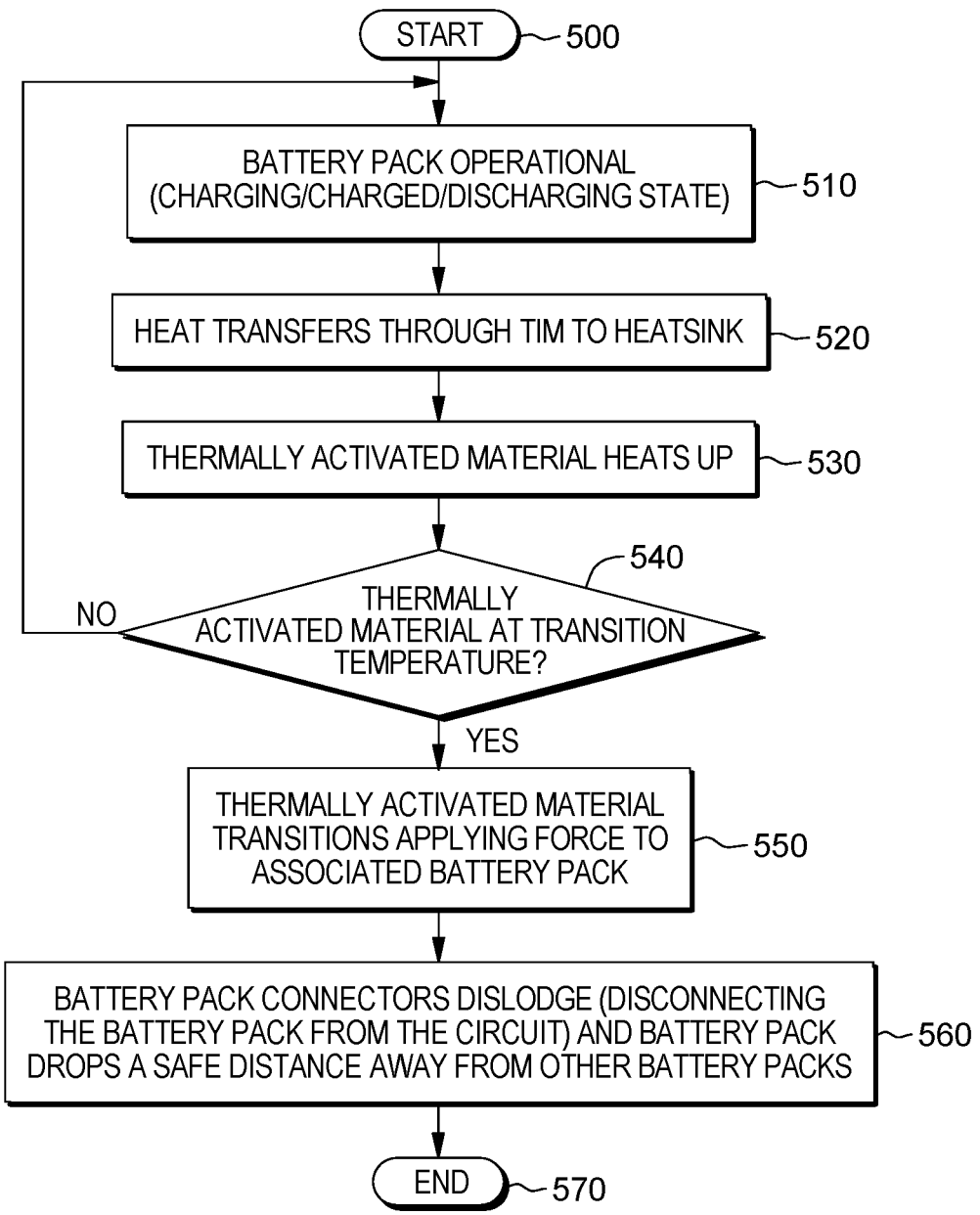
FIG. 5 depicts one embodiment of a process for automatically disconnecting a battery pack from a structure, such as a circuit board or housing, of a battery pack system, in accordance with one or more aspects of the present invention.

FIG. 5 depicts one embodiment of the process for automatically disconnecting a battery pack from a battery pack system, in accordance with one or more aspects of the present invention. The process starts 500 with a battery pack in operational state 510, that is, the battery pack can be in charging state, charged state, discharging state, without an out-of-specification temperature at the battery pack. Heat transfers through the thermal interface material to the heat sink for air-cooling of the battery pack 520. The thermally activated material of the thermally activated element heats up with this transfer of heat 530. Assuming that the thermally activated material remains below the material's transition temperature 540, then the process remains in this operational state, with heat being conducted to the heat sink and dissipated to the airflow through the system. In this normal operational state, the temperature of the thermally activated material will not reach its threshold for expansion, and the process loops back to the beginning, where the lithium-ion battery module continues to operate normally.

Should the thermally activated material reach its transition temperature 540, then the thermally activated material transitions to its pre-deformed configuration, forcing the associated battery pack away from the circuit board 550. In particular, if at least one of the lithium-ion batteries heats up to an abnormal level (indicating a failure event due to, for instance, an internal short), the heat transferred through the TIM to the heat sink will transfer to the thermally activated material, allowing the material to reach its transition temperature for expansion. The force applied by the thermally activated material pushing the battery pack and the circuit board apart is sufficient to dislodge the battery pack connectors from the associated connectors of the circuit board, mechanically disconnecting the battery pack from the circuit board, and allowing the battery pack to drop a safe distance away from the other battery packs 560, which completes the automatic disconnecting of the battery pack 570. Note in this regard that connector plug force for the battery packs can be approximately 3-6 pounds, and the estimated weight of a battery pack depicted may be about 1 pound. Nitinol shape-memory alloy is capable of supplying approximately 15 pounds of force per $mm^2$, and intumescent materials are capable of supplying approximately three pounds of force per $mm^2$. Because the lithium-ion battery pack is suspended from a structure, such as the circuit board, gravity also assists in dislodging the pack. Guide pins could also be added to the ends of the lithium-ion battery packs to ensure that a battery pack drops straight down, and does not cantilever into contact with one or more other battery packs in the system. In one or more implementations, if a battery pack is separated from the circuit board, by the connectors being disconnected, then the entire charging circuit could be disabled if the battery packs are connected in series. Rather than breaking a series circuit when a battery pack is disconnected, the disconnect action could activate a switching mechanism that places an impedance (approximately equal to that of the disconnected battery pack) in place of the pack such that the remainder of the battery packs continue to operate. In such a case, the overall stored voltage of the battery pack system would decrease by the voltage capacity of the disconnected battery pack.

FIGS. 6A-7B depict one embodiment of the disconnect mechanism in operation.

Figure 7A:
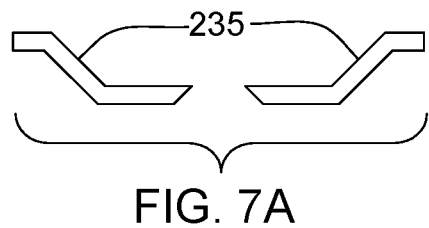
FIG. 7A depicts one embodiment of the thermally activated elements of the battery pack system of FIG. 6A, shown in a non-extended state during a normal operational state of the battery pack, in accordance with one or more aspects of the present invention.

Referring first to FIG. 6A, a cross-sectional elevational depiction of power system 200 of FIG. 3 is illustrated, wherein one or more air-moving devices 205 move air through housing 201, which contains battery pack system 210, in accordance with one or more aspects of the present invention. As noted, battery pack system 210 includes circuit board 220 with one or more battery packs 230 suspended (in one embodiment) from a main surface of circuit board 220 via one or more respective connectors 232 associated with each battery pack 230. As illustrated, a disconnect mechanism (in one embodiment) includes one or more thermally activated elements 235, which can be formed of thermally activated material. In FIG. 6A, battery pack system 210 is shown to further include a signal transition board 221, electrical contacts 238 on a lower surface of each battery pack 230, and a riser card 239 electrically coupling signal transition board 221 to circuit board 220. By way of example, the thermally activated elements 235 are shown non-extended, in a normal operational state of the associated battery pack. For instance, FIG. 6A assumes that all battery cells are within specified operating ranges, and the thermally activated material is below transition temperature. Thus, the material's shape is an unchanged, initial shape. Further, the connectors 232 are engaged with circuit board 220, and the bypass line formed by contacts 238 contacting respective electrical circuits on signal transition board 221, is disengaged. By way of example, FIG. 7A depicts the initial, unchanged shape of the thermally activated element(s) 235, in one embodiment. Note that this embodiment is provided by way of example only, and multiple various configurations of the thermally activated element(s) can be provided in order to generate the desired force upon occurrence of a failure event to facilitate dropping of the respective pack(s) away from the circuit board, and the other battery packs of the battery pack system.

Figure 7B:
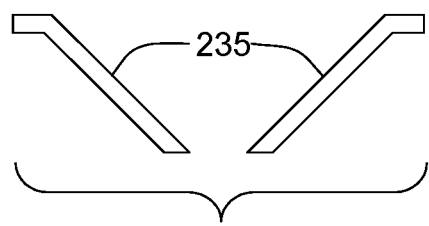
FIG. 7B depicts the thermally activated elements of FIG. 7A, shown transitioned to an extended state to facilitate disconnecting the respective battery pack from the circuit board, as illustrated in FIG. 6B, in accordance with one or more aspects of the present invention.

In FIG. 6B, battery pack system 210 is shown with a battery pack 230 disengaged or disconnected from circuit board 220 due to a failure event at the battery pack. In one or more embodiments, with a thermal runaway event at the battery pack, excessive heat is generated within the pack and conducted to the thermally activated element(s) disposed between the battery pack and the circuit board 220. Once the thermally activated element(s), or more particularly, the thermally activated material, reaches its transition temperature, the thermally activated element(s) 235 transitions to an extended state, such as shown in FIGS. 6B & 7B. As explained herein, the thermally activated material is pre-configured and sized to apply in an extended state a force between the associated battery pack and the circuit board sufficient to disconnect the one or more connectors coupling the battery pack to the circuit board, thereby allowing the battery pack to drop away from the circuit board by gravity. As noted, guide pins could be added to the ends of the battery pack to ensure that each battery pack drops straight down, and does not cantilever with disconnecting of the battery pack from the circuit board. In the embodiment depicted, contacts 238 engage signal transition board 221, and in particular, corresponding circuitry on signal transition board 221, in order to engage a bypass line or impedance, to place the engaged bypass in place of the disengaged battery pack (e.g., in series or parallel with the other battery packs remaining in the operational configuration). This action can assist battery pack system 210 to continue to operate, notwithstanding occurrence of a failure event at one of the battery packs, and disconnecting of that battery pack from the system. As noted, the particular configuration and size of the thermally activated element(s) 235 can vary, with the elements being designed to provide the required force to disengage the battery pack from the circuit board when in the extended state.

By way of further example, the specification for a battery pack system can be such that the battery pack should not exceed 75° C. With this specification, a Nitinol shape-memory alloy can be selected with an activation temperature in the range of 80°-100° C. The response time of the SMA is dependent upon the current. Many SMAs will fully change state in 5-10 seconds for currents around 0.5 amps, with the value dropping to a few milliseconds if the current is increased to a value of around, for instance, 10 amps. Since the SMA transition temperature is much lower than the battery cell ignition temperature, it is ensured that the thermally activated elements will disengage the respective battery pack with the failure event well before the thermal runaway event at the battery pack could result in ignition of the battery pack, thereby assisting in containing the event.

Figure 8:
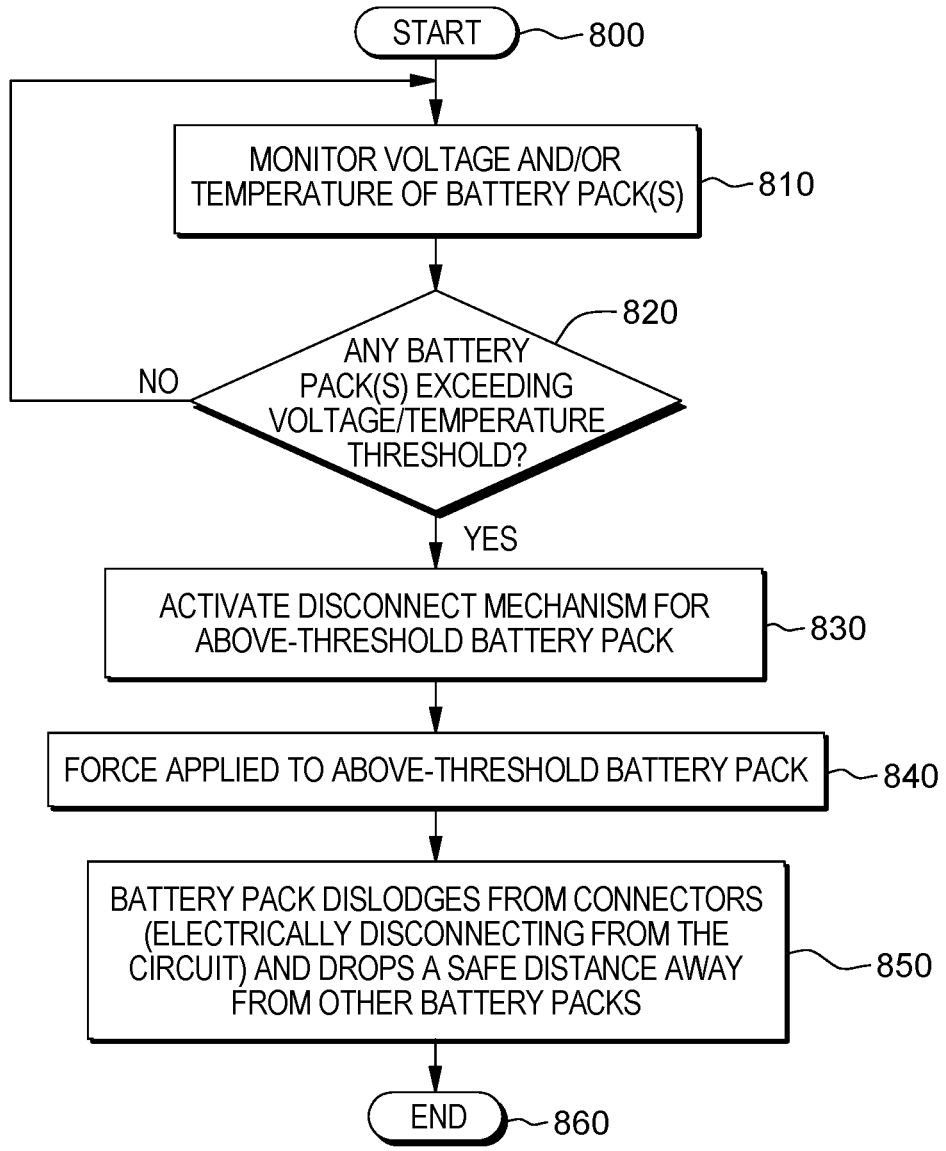
FIG. 8 depicts one embodiment of an alternate process for automatically disconnecting a battery pack from a structure, such as a circuit board or housing, of a battery pack system, in accordance with one or more aspects of the present invention.

FIG. 8 depicts an alternate embodiment of a process for disconnecting a battery pack from a battery pack system, in accordance with one or more aspects of the present invention. In this approach, battery or battery pack voltage and/or temperature can be monitored by a controller, where the separation of a battery pack from a structure, such as the circuit board, can be actuated by an electrical signal from the controller if a defined threshold indicating a battery anomaly is exceeded. The disconnect mechanism can be (or include) an actuator, solenoid, switch, shape-memory alloy, heating pad connected to an intumescent material, etc., controlled by the controller. Further, as noted above, rather than breaking a series circuit if one of the battery packs is disconnected, the disconnect action could result in a switching mechanism placing an impedance equal to that of the disconnected battery pack in place of the pack such that the remainder of the battery packs continue to operate.

One embodiment of a process in accordance with the above-noted alternate embodiment is depicted in FIG. 8. The process starts 800 with a controller monitoring voltage and/or temperature of battery packs within the battery pack system 810. Processing determines whether any battery pack exceeds its voltage and/or temperature threshold 820. If "no", then the process loops back to continue to monitor the voltage and/or temperature of the battery packs. Should a battery pack voltage and/or temperature exceed its corresponding threshold, then the controller activates the disconnect mechanism for the above-threshold battery pack 830. The disconnect mechanism applies force to the battery pack 840 to dislodge or disconnect the connectors of the battery pack (e.g., disconnecting the battery pack from the housing, or the circuit board), and the battery pack drops a safe distance away from the other battery packs 850, which completes the disconnect process for that battery pack 860.

Figure 9A:
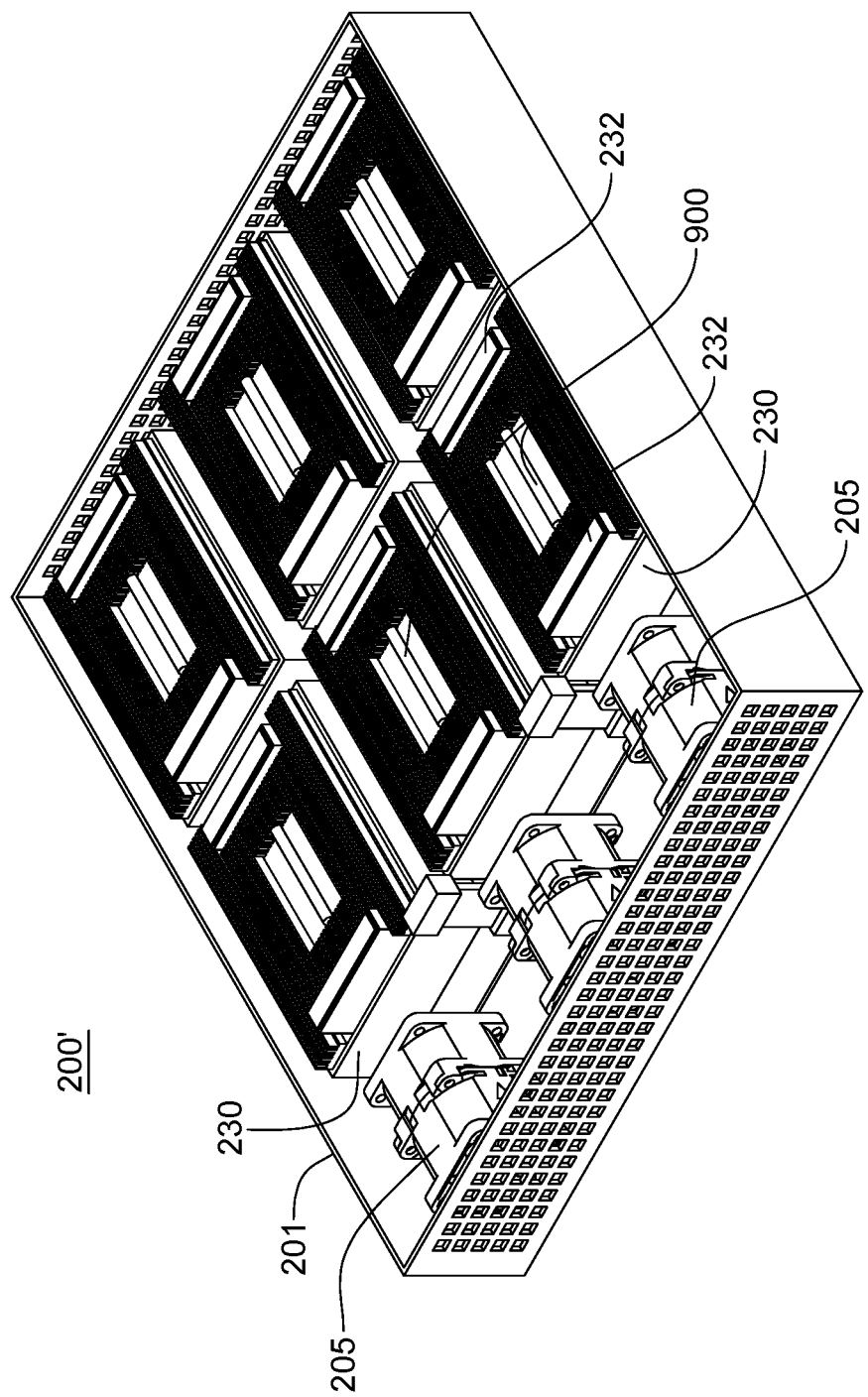
FIG. 9A depicts the battery pack system embodiment of FIG. 3, with an alternate embodiment of the disconnect mechanism, in accordance with one or more aspects of the present invention.
Figure 9B:
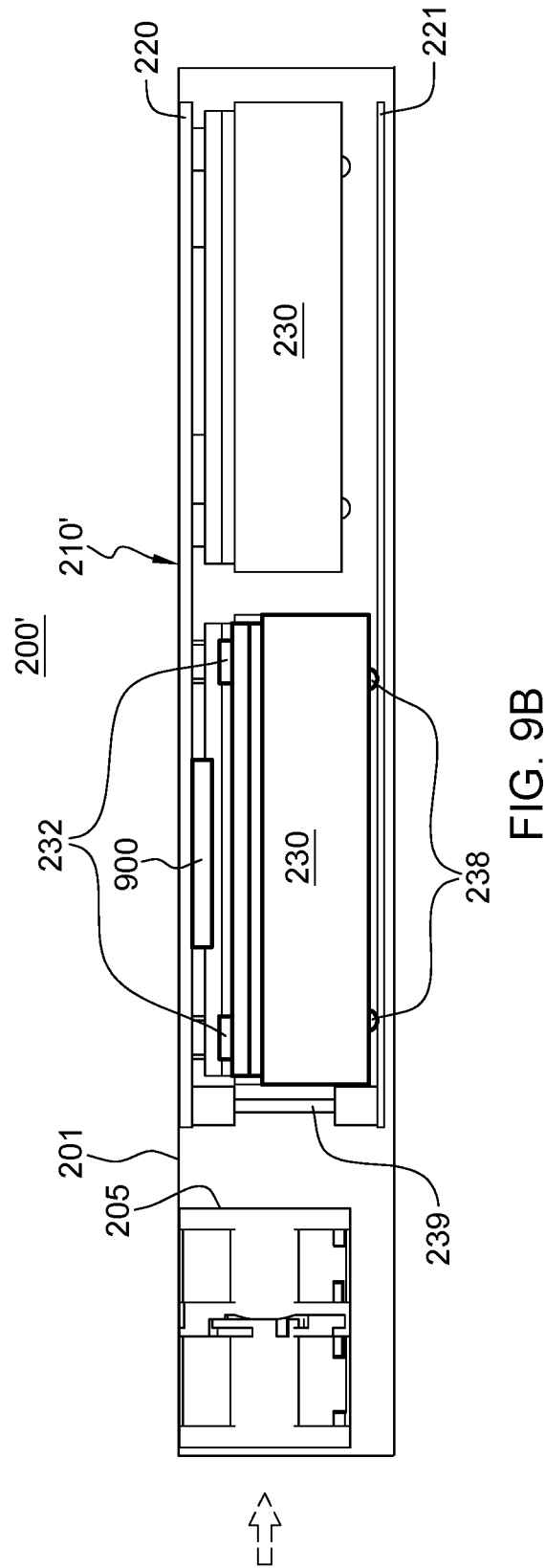
FIG. 9B is a cross-sectional elevational depiction of the battery pack system of FIG. 9A, showing multiple battery packs operatively connected to the circuit board, and one battery pack after disconnect from the circuit board with occurrence of a failure event at the battery pack, in accordance with one or more aspects of the present invention.

FIGS. 9A & 9B depict one embodiment of a power system 200' similar to power system 200 of FIGS. 2-6B. The difference depicted in FIGS. 9A & 9B is that the disconnect mechanism includes a solenoid 900 located between each battery pack 230 and circuit board 220 of battery pack system 210. This power system 200' can be utilized with a process such as described above in connection with FIG. 8. For instance, a respective solenoid 900 can be activated to disengage the associated battery pack 230 from the circuit board upon detection of a failure event by a controller associated with the battery pack system, where the controller receives temperature and/or voltage data from temperature and/or voltage sensors associated with (for instance) each battery pack, or each battery cell of each battery pack, as desired. In other respects, power system 200' can be similar in structure and operation to that described above in connection with FIGS. 2-6B.

Those skilled in the art will note from the description provided herein that a battery pack systems and methods of fabrication are disclosed which utilize, or include, in one or more embodiments, a perforated housing containing, for instance, one or more air-moving devices, a circuit board, and a plurality of battery packs suspended within the housing via connectors. For instance, the plurality of battery packs can be connected to a surface of the circuit board by the connectors. The battery packs can be, in one or more embodiments, lithium-ion battery packs, which include one or more battery cells. Further, the battery pack system can include connectors for connecting the battery pack to the circuit board, thermal interface material for transferring heat to a heat sink for air-cooling the battery pack, and a disconnect mechanism disposed between the respective battery pack and the circuit board. Note in this regard, that although lithium-ion batteries are described by way of example herein, the systems and methods disclosed apply to other energy storage devices, such as NiMH batteries, fuel cells, or another other battery, voltage storage, or current storage devices.

In one or more embodiments, the disconnect mechanism includes a thermally activated element formed of a thermally activated material, where the thermally activated element separates a battery pack from the circuit board should a failure event occur at that battery pack, such as within one or more battery cells of the battery pack. In one or more embodiments, the thermally activated material can be a shape-memory alloy or a bimetallic material. Further, separation of the battery pack from the circuit board can electrically disconnect the charging circuit, or the charging circuit could remain with an impedance inserted or switched into the circuit with disconnect of the above-threshold battery pack. In operation, disconnect of a battery pack results in the battery pack dropping a safe distance away from other battery packs to prevent cascading of a failure event within the battery pack system. In one or more alternate implementations, voltage and/or temperature of the battery packs or battery cells can be monitored, and in the event of a temperature and/or voltage threshold being reached, an electrical signal can be provided by a controller to activate disconnect of the effected battery pack via an appropriate disconnect mechanism, such as a solenoid mechanism, switch mechanism, actuator-driven mechanism, etc. Further, and as noted, disconnection of a battery pack can, in one or more embodiments, activate a switching mechanism that places an impedance equal to that of the disconnected battery pack in place of the battery pack such that the remainder of the battery packs continue to operate normally within the battery pack system.

Figure 10:
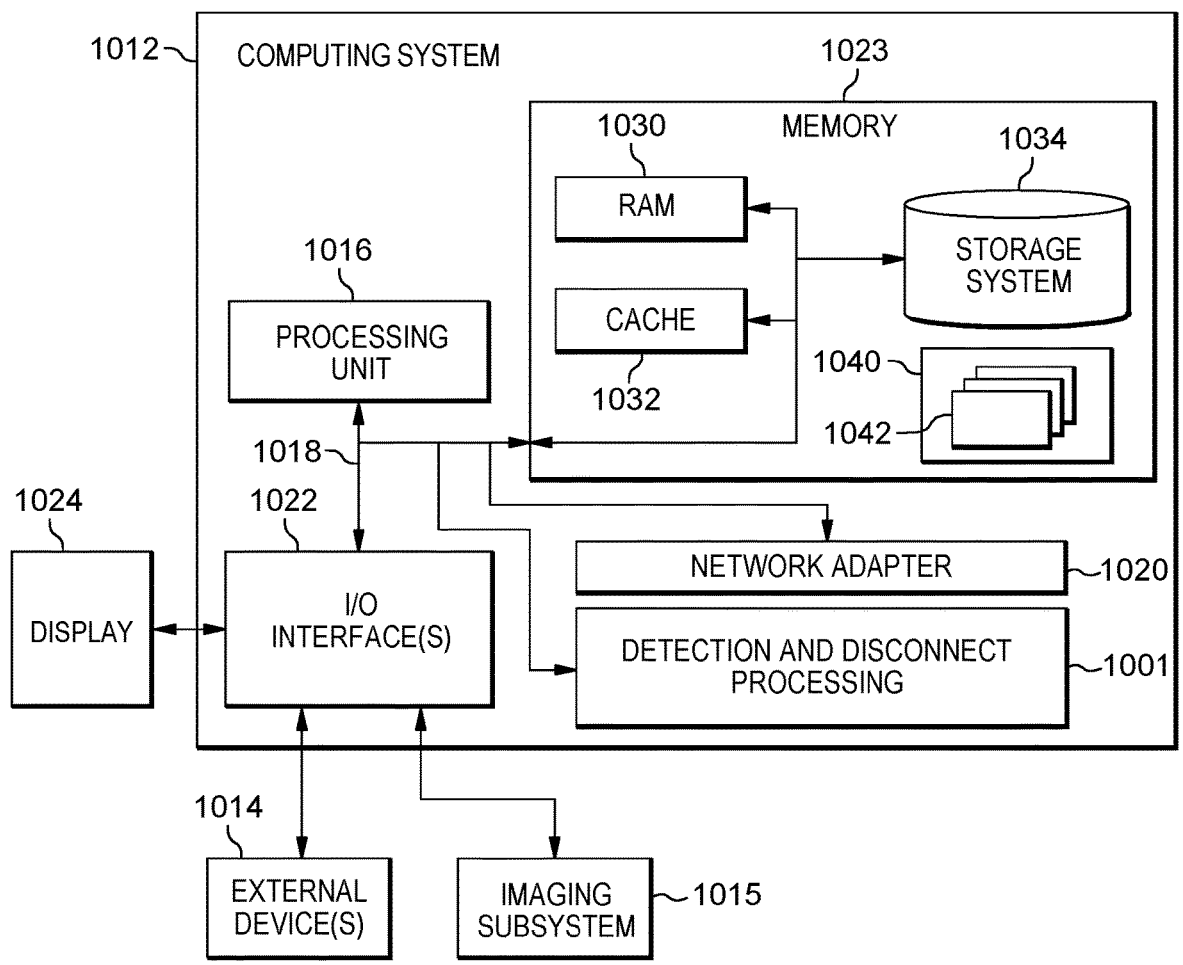
FIG. 10 depicts one embodiment of a computing system (or controller) for facilitating, in one or more embodiments, battery failure detection and/or disconnect of a failing battery pack from a battery pack system, in accordance with one or more aspects of the present invention.

By way of further example, FIG. 10 depicts one embodiment of a computing environment 1000, which includes a computing system 1012. Examples of well-known computing systems, environments, and/or configurations that can be suitable for use with computer system 1012 include, but are not limited to, a mobile device, such as a wireless computer, a handheld or laptop computer or device, a mobile phone, a programmable consumer electronic device, a tablet, a personal digital assistant (PDA), or the like.

Computing system 1012 can be described in the general context of computer system-executable instructions, such as program modules, being executed by a computer system. Generally, program modules can include routines, programs, objects, components, logic, data structures, and so on that perform particular tasks or implement particular abstract data types.

As depicted in FIG. 10, computing system 1012, is shown in the form of a general-purpose computing device. The components of computing system 1012 can include, but are not limited to, one or more processors or processing units 1016, a system memory 1023, and a bus 1018 that couples various system components including system memory 1023 to processor 1016.

In one embodiment, processor 1016 can be based on any one of multiple available operating system architectures, including mobile device operating systems.

Bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 1012 can include a variety of computer system readable media. Such media may be any available media that is accessible by computing system 1012, and it includes both volatile and non-volatile media, removable and non-removable media.

System memory 1023 can include computer system readable media in the form of volatile memory, such as random access memory (RAM) 1030 and/or cache memory 1032. Computing system 1012 can further include other removable/non-removable, volatile/non-volatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 1018 by one or more data media interfaces. As described below, memory 1023 can include at least one program product having a set (e.g., at least one) of program modules that are configured to carry out the functions of embodiments of the invention.

Program/utility 1040, having a set (at least one) of program modules 1042, can be stored in memory 1023 by way of example, and not limitation, as well as an operating system, one or more application programs, other program modules, and program data. Each of the operating system, one or more application programs, other program modules, and program data or some combination thereof, can include an implementation of a networking environment. Program modules 1042 generally carry out various functions and/or methodologies of embodiments of the invention as described herein. Alternatively, a separate, detection and disconnect system, module, logic, etc., 1001 can be provided in associated with computing system 1012 to facilitate implementing one or more failure detection and/or disconnect control processes such as described herein.

Computing system 1012 can also communicate with one or more external devices 1014, such as an imaging subsystem 1015, a keyboard, a pointing device, a display 1024, etc.; one or more devices that enable a user to interact with computing system 1012; and/or any devices (e.g., network card, modem, etc.) that enable computing system 1012 to communicate with one or more other computing devices. Such communication can occur via Input/Output (I/O) interfaces 1022. Still yet, computing system 1012 can communicate with one or more networks such as a local area network (LAN), a general wide area network (WAN), and/or a public network (e.g., the Internet) via network adapter 1020. As depicted, network adapter 1020 communicates with the other components of computing system, 1012, via bus 1018. It should be understood that although not shown, other hardware and/or software components could be used in conjunction with computing system 1012. Examples, include, but are not limited to: microcode, device drivers, redundant processing units, external disk drive arrays, RAID systems, tape drives, and data archival storage systems, etc.

One or more aspects of the present invention, such as one or more aspects of the control aspect, can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects can be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider can receive payment from the customer under a subscription and/or fee agreement, as examples. Additionally or alternatively, the service provider can receive payment from the sale of advertising content to one or more third parties.

In one aspect, an application can be deployed for performing one or more embodiments. As one example, the deploying of an application comprises providing computer infrastructure operable to perform one or more embodiments.

As a further aspect, a computing infrastructure can be deployed comprising integrating computer readable code into a computing system, in which the code in combination with the computing system is capable of performing one or more embodiments.

As yet a further aspect, a process for integrating computing infrastructure comprising integrating computer readable code into a computer system can be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but can also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A battery pack system comprising:
    a housing;
    a circuit board disposed within the housing;
    multiple battery packs electrically connected to, and suspended from, the circuit board within the housing, a selected battery pack of the multiple battery packs being suspended within the housing above an empty region in the housing, and the selected battery pack being suspended from the circuit board by one or more connectors; and
    a disconnect mechanism located between the battery pack and the circuit board, and configured to disconnect the selected battery pack with a failure event at the selected battery pack by, at least in part, disconnecting the one or more connectors, the disconnecting of the one or more connectors by the disconnect mechanism with the failure event releasing the selected battery pack to physically drop away from the circuit board to the empty region within the housing a safe distance away from other battery packs of the multiple battery packs in the battery pack system.

2. The battery pack system of claim 1, further comprising one or more air-moving devices disposed within the housing to move air through the housing, wherein the battery pack system is an air-cooled battery pack system.

3. The battery pack system of claim 1, wherein the disconnect mechanism comprises one or more thermally activated elements coupled to the selected battery pack and formed of thermally activated material disposed between the circuit board and the selected battery pack, and the failure event comprises an excessive temperature at the selected battery pack, the one or more thermally activated elements transitioning to an extended state with the excessive temperature reaching a transition temperature of the thermally activated material, and the one or more thermally activated elements being configured and sized to force in the extended state the selected battery pack away from the circuit board to disconnect the one or more connectors connecting the selected battery pack to the circuit board.

4. The battery pack system of claim 3, wherein the thermally activated material comprises a material selected from the group consisting of shape-memory alloys, bimetallic material, and intumescent materials.

5. The battery pack system of claim 1, wherein the disconnect mechanism comprises a controller to detect the failure event, and a separator to disconnect the selected battery pack based on the controller detecting the failure event.

6. The battery pack system of claim 5, wherein the separator is disposed between the circuit board and the battery pack and controlled by the controller.

7. The battery pack system of claim 1, wherein the one or more connectors comprise at least one electrical connector, the disconnect mechanism disconnecting or open-circuiting the at least one electrical connector to electrically disconnect the selected battery pack from the circuit board with occurrence of the failure event.

8. The battery pack system of claim 1, wherein the selected battery pack is part of a charging circuit, and wherein the battery pack system further comprises a switching mechanism to switch in an impedance to the charging circuit with disconnecting of the selected battery pack by the disconnect mechanism based on the failure event.

* * * * *